(12) United States Patent
Görtz et al.

(10) Patent No.: US 9,678,262 B2
(45) Date of Patent: Jun. 13, 2017

(54) LASER-OPERATED LIGHT SOURCE

(71) Applicant: QIOPTIQ PHOTONICS GMBH & CO. KG, Göttingen (DE)

(72) Inventors: Björn Görtz, Göttingen (DE); Dieter Frerking, Gladebeck (DE); Thomas Thöniβ, Göttingen (DE); Claus Spruch, Göttingen (DE)

(73) Assignee: Qloptiq Photonics GmbH & Co. KG, Göttlingen (DE)

( * ) Notice: Subject to any disclaimer, the term of this patent is extended or adjusted under 35 U.S.C. 154(b) by 247 days.

(21) Appl. No.: 14/491,079

(22) Filed: Sep. 19, 2014

(65) Prior Publication Data

US 2015/0085517 A1    Mar. 26, 2015

(30) Foreign Application Priority Data

Sep. 20, 2013 (DE) ........................ 10 2013 110 387

(51) Int. Cl.
*F21V 8/00* (2006.01)
*G06F 17/50* (2006.01)
*G02B 6/42* (2006.01)

(52) U.S. Cl.
CPC ......... *G02B 6/0006* (2013.01); *G02B 6/4296* (2013.01); *G06F 17/50* (2013.01); *G02B 6/4206* (2013.01); *G02B 6/4298* (2013.01)

(58) Field of Classification Search
CPC .. G02B 6/0006; G02B 6/4296; G02B 6/4298; G02B 6/4206; G06F 17/50
USPC .................................................. 362/553, 259
See application file for complete search history.

(56) References Cited

U.S. PATENT DOCUMENTS

| 3,502,929 A | 3/1970 | Richter |
| 3,619,588 A | 11/1971 | Chambers |
| 3,826,996 A | 7/1974 | Jaegle |
| 3,900,803 A | 8/1975 | Silfvast et al. |

(Continued)

FOREIGN PATENT DOCUMENTS

| FR | 2554302 A | 5/1985 |
| JP | S61-193356 A | 8/1986 |

(Continued)

OTHER PUBLICATIONS

Extended European Search Report for application 14185612.0, dated Feb. 9, 2015.

(Continued)

*Primary Examiner* — Laura Tso
(74) *Attorney, Agent, or Firm* — Peter A. Nieves; Sheehan Phinney Bass & Green PA

(57) ABSTRACT

A laser-operated light source encompasses a chamber for accommodating an ionizable gas and an ignition source for ionizing the gas in the chamber for generating a plasma. The light source encompasses a laser for inputting laser energy into the plasma such that, under the impact of the laser radiation, the plasma emits useful light, which forms the output signal of the light source, wherein provision is made for means for coupling the useful light into a transferring optical fiber. An optical system for imaging the plasma onto the end of the optical fiber, which faces the optical system, is arranged between the chamber and the transferring optical fiber, wherein the optical system is corrected for reducing the chromatic aberration.

29 Claims, 4 Drawing Sheets

(56) References Cited

U.S. PATENT DOCUMENTS

| | | |
|---|---|---|
| 4,088,966 A | 5/1978 | Samis |
| 4,152,625 A | 5/1979 | Conrad |
| 4,498,029 A | 2/1985 | Yoshizawa |
| 4,646,215 A | 2/1987 | Levin |
| RE32,626 E | 3/1988 | Yoshizawa |
| 4,738,748 A | 4/1988 | Kisa |
| 4,780,608 A | 10/1988 | Cross et al. |
| 4,789,788 A | 12/1988 | Cox |
| 4,866,517 A | 9/1989 | Mochizuki et al. |
| 4,901,330 A | 2/1990 | Wolfram |
| 5,747,813 A | 5/1998 | Norton et al. |
| 5,905,268 A | 5/1999 | Garcia et al. |
| 5,940,182 A | 8/1999 | Lepper, Jr. et al. |
| 5,946,141 A | 8/1999 | Harrington |
| 6,184,517 B1 | 2/2001 | Sawada |
| 6,288,780 B1 | 9/2001 | Fairley et al. |
| 6,414,436 B1 | 7/2002 | Eastlund |
| 6,417,625 B1 | 7/2002 | Brooks et al. |
| 6,541,924 B1 | 4/2003 | Kane et al. |
| 6,679,276 B1 | 1/2004 | Brown et al. |
| 6,737,809 B2 | 5/2004 | Espiau et al. |
| 6,762,849 B1 | 7/2004 | Rulkens |
| 6,788,404 B2 | 9/2004 | Lange |
| 6,956,329 B2 | 10/2005 | Brooks et al. |
| 6,960,872 B2 | 11/2005 | Beeson |
| 6,972,421 B2 | 12/2005 | Melnychuk |
| 7,050,149 B2 | 5/2006 | Owa et al. |
| 7,295,739 B2 | 11/2007 | Solarz |
| 7,307,375 B2 | 12/2007 | Smith |
| 7,390,116 B2 | 6/2008 | Jain |
| 7,427,167 B2 | 9/2008 | Holder et al. |
| 7,429,818 B2 | 9/2008 | Chang et al. |
| 7,435,982 B2 | 10/2008 | Smith |
| 7,439,530 B2 | 10/2008 | Ershov |
| 7,652,430 B1 | 1/2010 | Delgado |
| 7,679,276 B2 | 3/2010 | Blondia |
| 7,744,241 B2 | 6/2010 | Xu |
| 7,786,455 B2 | 8/2010 | Smith |
| 7,989,786 B2 | 8/2011 | Smith |
| 8,192,053 B2 | 6/2012 | Owen et al. |
| 8,309,943 B2 | 11/2012 | Smith |
| 8,525,138 B2 | 9/2013 | Smith |
| 8,969,841 B2 | 3/2015 | Smith |
| 9,048,000 B2 | 6/2015 | Smith |
| 9,185,786 B2 | 11/2015 | Smith |
| 2001/0016430 A1 | 8/2001 | Nakano |
| 2001/0035720 A1 | 11/2001 | Guthrie et al. |
| 2002/0017223 A1 | 2/2002 | Chang |
| 2002/0021508 A1 | 2/2002 | Ishihara |
| 2002/0044629 A1 | 4/2002 | Hertz |
| 2002/0080834 A1 | 6/2002 | Kusunose |
| 2003/0052609 A1 | 3/2003 | Eastlund |
| 2003/0068012 A1 | 4/2003 | Ahmad |
| 2003/0147499 A1 | 8/2003 | Kondo |
| 2003/0168982 A1 | 9/2003 | Kim |
| 2003/0231496 A1 | 12/2003 | Sato |
| 2004/0016894 A1 | 1/2004 | Wester |
| 2004/0026512 A1 | 2/2004 | Otsubo |
| 2004/0129896 A1 | 7/2004 | Schmidt |
| 2004/0183031 A1 | 9/2004 | Silverman et al. |
| 2004/0183038 A1 | 9/2004 | Hiramoto et al. |
| 2004/0238762 A1 | 12/2004 | Mizoguchi et al. |
| 2004/0264512 A1 | 12/2004 | Hartlove et al. |
| 2005/0167618 A1 | 8/2005 | Hoshino et al. |
| 2005/0205811 A1 | 9/2005 | Partlo et al. |
| 2005/0207454 A1 | 9/2005 | Starodoumov et al. |
| 2005/0225739 A1 | 10/2005 | Hiura |
| 2005/0243390 A1 | 11/2005 | Tejnil |
| 2006/0039435 A1 | 2/2006 | Cheymol |
| 2006/0097203 A1 | 5/2006 | Bykanov et al. |
| 2006/0109455 A1 | 5/2006 | Haverlag |
| 2006/0152128 A1 | 7/2006 | Manning |
| 2006/0192152 A1 | 8/2006 | Ershov |
| 2006/0219957 A1 | 10/2006 | Ershov |
| 2007/0139924 A1 | 6/2007 | Easley et al. |
| 2007/0228288 A1 | 10/2007 | Smith |
| 2007/0228300 A1 | 10/2007 | Smith |
| 2007/0285921 A1 | 12/2007 | Zulim et al. |
| 2008/0055712 A1 | 3/2008 | Noelscher |
| 2008/0073598 A1 | 3/2008 | Moriya et al. |
| 2012/0261587 A1 | 10/2012 | Kellogg et al. |
| 2013/0329204 A1* | 12/2013 | Pellemans ............... H05H 1/24 355/67 |
| 2016/0057845 A1 | 2/2016 | Smith |

FOREIGN PATENT DOCUMENTS

| | | |
|---|---|---|
| JP | H04-144053 A | 5/1992 |
| JP | 08299951 | 11/1996 |
| JP | 2009-317675 A | 11/2003 |
| JP | 2006010675 A | 1/2006 |
| KR | 1020080108111 | 12/2008 |
| WO | 03041906 | 5/2003 |
| WO | 2004097520 A2 | 11/2004 |
| WO | WO2007120521 | 10/2007 |
| WO | WO2010002766 | 1/2010 |
| WO | 2010093903 | 8/2010 |

OTHER PUBLICATIONS

Anonymous: Xenon Arc Lamp—Wikipedia, the free encyclopedia; Aug. 19, 2013, retrieved from Internet on Feb. 18, 2015: https://web:archive.org/web/20130819001533/http://en.wikipedia.org/wiki/xenon_arc_amp.

H.M. Pask, et al; Ytterbium-Doped Silica Fiber Lasers; Versatile Sources for the 1-1.2 um Region; IEEE Journal of Selected Topics in Quantum Electronics vol. 1, No. 1; Apr. 1993.

Christian Steven; A 1-kW CW Thin Disc Laser; IEEE Journal of Selected Topics in QUantum Electronics, vol. 6, No. 4, Jul./Aug. 2000.

Hecht, Eugene; Optics, 4ed; Pearson Addison Wesley; 2002; pp. 149-171, 243-273, 365-442.

KLA-Tencor; High Power Laser-Sustained Plasma Light Sources for KLA-Tencor Broadband Inspection Tools; Conference Paper • May 2015.

Davis, Christopher C.; Lasers and Electro-Optics; Fundamentals and Engineering; 1996, Cambridge University Press, pp. 14-35.

Tam, Quasiresonant laser-produced plasma; an efficient mechanism for localized breakdown; J. Appl. Phys. 51(9), Sep. 1980, p. 4682.

Measures, et al; Laser Interaction based on resonance saturation (LIBORS): an alternative to inverse bremsstrahlung for coupling laser energy into a plasma; Applied Optics, vol. 18, No. 11, Jun. 1, 1979.

Eletskil et al; Formation kinetics and parameters of a photoresonant plasma; Sov. Phys. JETP 67 (5); May 1988.

Baliman, et al; Synthetic Quartz with High Ultraviolet Transmission; Applied Optics; Jul. 1968, vol. 7, No. 7.

Energetiq Technology, Inc; LDLS™ Laser-Driven Light Source Data Sheet; 2008.

Patel and Zaidi, The suitability of sapphire for laser windows, MEas. Sci. Technol. 10 (1999).

Waynant, et al; Electro-Optics Handbook, Second Edition; Chapter 10; published by McGraw-Hill, 2000.

Excelitas Technologies Corp.; Cermax® Xenon Lamp Engineering Guide, 2011.

Perkinelmer Optoelectronics; Cermax® Xenon Lamp Engineering Guide, 1998.

G C Wei; Transparent ceramic lamp envelope materials; J. Phys. D: Appl. Phys. 38 (2005) 3057-3065.

PASCO Scientific; Instruction Sheet for the PASCO Model OS-9286A Mercury Vapor Light Source; 1990.

Generalov et al; "Continuous Optical Discharge," ZhETF Pls. Red. 11, No. 9, May 5, 1970, pp. 302-304.

Kozlov et al; "Radiative Losses by Argon Plasma and the Emissive Model of a Continuous Optical Discharge"; Sov. Phys.JETP, vol. 39, No. 3, Sep. 1974, pp. 463-468.

Wilbers et al, "The Continuum Emission of an Arc Plasma," J. Quant. Spectrosc. Radiat. Transfer, vol. 4, No. 1, 1991, pp. 1-10.

(56) References Cited

OTHER PUBLICATIONS

Wilbers, et al "The VUV Emissitivity of a High-Pressure Cascade Argon Arc from 125 to 200 nm," J.Quant. Spectrosc. Radiat. Transfer, vol. 46, 1991, pp. 299-308.
Luxtell LLC CeraLux Xenon Lamps Product Data Sheet; 2003-2004.
Laufer, Gabriel; Introduction to Optics and Lasers in Engineering; pp. 449-454; Cambridge University Press, 1996.
Yu, et al; LED-Based Projection Systems; Journal of Display Technology, vol. 3, No. 3, Sep. 2007.
Derra et al; UHP lamp systems for projection applications; J. Phys. D: Appl. Phys. 38 (2005) 2995-3010.
Ingle, James D., et al; Spectrochemical Analysis; 1988, Prentice-Hall Inc.: p. 59.
M.J. Soileau et al., Laser-Induced Damage Measurements in CdTe and Other II-VI Materials, Applied Optics, vol. 21, No. 22, pp. 4059-4062.
Roy Henderson et al., Laser Safety, pp. 435-443 (2004).
Turan Erdogam Ph.D., CTO Semroc, Inc., A Unit of IDEX Corp; letter dated Feb. 28, 2011 regarding Energetiq Technology's EQ-99 system.
Winners of 2010 Prism Awards Announced, Jan. 27, 2011; webpage from photonics.com.
http://www.rdmag.com/award-winners/2011/08/light-source-life-time-lifted-laser-tech; The EQ-99 LDLS Laser-Driven Light Source, produced by Energetiq Technology Inc. 2011.
Energetiq Technology Inc. Press Release: Energetiq Announces Ultra-Compact Light Source for Next Generation HPLC and Advanced Microscopy; Jan. 21, 2010.
KLA-Tencor Launches 2830 and Puma 9500 Series, eDR-5210 | Product Released | Press Releases; Jul. 13, 2009.
I.M. Beterov et al., "Resonance radiation plasma (photoresonance plasma)", Sov. Phys. Usp. 31 (6), 535 (1988).
D. Keefer, "Laser Sustained Plasmas," Chapter 4, in Radziemski et al., "Laser-Induced Plasmas and Applications," CRC Press (1989).
Norbert R. Böwering et al., "EUV Source Collector," Proc. of SPIE vol. 6151, (Mar. 10, 2006.)
William T. Silfvast, Laser Fundamentals, 2d ed., pp. 1-6 (2004).
Arp et al., Feasibility of generating a useful laser-induced breakdown spectroscopy plasma on rocks at high pressure: preliminary study for a Venus mission, published Jul. 30, 2004.
J. Uhlenbusch and W. Viöl, "Hβ-Line Profile Measurements in Optical Discharges", J, Quant. Spectrosc. Radiat. Transfer, vol. 44, No. 1, 47-58 (1990).
DS004 EQ-10M—Data Sheet, Energetiq, 2005.
John Powell and Claes Magnusson; Handbook of Laser Technologies and Applications vol. III Applications, Part D:1.2, pp. 1587-1611; 2004, published by Institute of Physics Publishing.
Digonnet, Michael J.F., editor; Rare-Earth-Doped-Fiber Lasers and Amplifiers, Second Edition, Revised and Expanded, published by Marcel Dekker, Inc., 2001, pp. 144-170.
Cremers, et al; Evaluation of the Continuous Optical Discharge for Spectrochemical Analysis; Spechtrochimica Acta, Part B. Atomic Spectroscopy; vol. 40B No. 4, 1985.
ASML's customer magazine, 2014, ASML Holding BV.
Raizer, Yuri P.; Gas Discharge Physics, Springer-Verlag 1991; pp. 35-51; 307-310.
Raizer, Yuri P.; Gas Discharge Physics, Springer-Verlag corrected and printed 1997; pp. 35-51; 307-310.
V. P. Zimakov, et al; Interaction of Near-IR Laser Radiation with Plasma of a Continuous Optical Discharge; Plasma Physics Reports, 2016, vol. 42, No. 1, pp. 68-73.
Bezel, et al "High-Power Laser-Sustained Plasma Light Sources for KLA-Tencor Broadband Inspection Tool"; Conference Paper • May 2015, KLATencor, Milpitas, California.
Energetiq Technology, Inc.; LDLS™ Laser-Driven Light Source EQ-1000 High Brightness DUV Light Source Data Sheet; 2008; Woburn, Massachusetts.

Rudoy, et al; Xenon Plasma Sustained by Pulse-Periodic Laser Radiation; Plasma Physics Reports, 2015, vol. 41, No. 10, pp. 858-861, Pleiades Publishing, Ltd., 2015.
Knecht, et al; Optical pumping of the XeF(C-+A) and iodine 1.315-pm lasers by a compact surface discharge system; Opt Eng. 42(12) 3612-3621 (Dec. 2003).
Fridman, et al; Plasma Physics and Engineering; Published in 2004 by Taylor & Francis, pp. 404-419; 618-619.
Model EQ-99 LDLS™ Laser-Driven Light Source; Operation and Maintenance Manual Revision Mar. 2, 2012.
Martin van den Brink; Many ways to shrink: The right moves to 10 nanometer and beyond; Presentation at ASML SmallTalk 2014; London; Nov. 2014.
Laser Pumped Plasma Broadband Light Souce by RnD Isan (no date).
Toumanov; Plasma and High Frequency Processes for Obtaining and Processing Materials in the Nuclear Fuel Cycle; Nova Science Publishers, Inc., New York, 2003, p. 60.
Klauminzer; Cost Considerations for Industrial Excimer Lasers; Laser Focus, The Magazine of Electro-Optics Technology; Dec. 1985.
S. C. Tidwell, ; Highly efficient 60-W TEMoo ow diode-end-pumped Nd:YAG laser; Optics Letters /vol. 18, No. 2 / Jan. 15, 1993, pp. 116-118.
R. J. Shine, Jr; 40-W cw, TEM00-mode, diode-laser-pumped, Nd:YAG miniature-slab laser; Mar. 1, 1995 / vol. 20, No. 5 / Optics Letters; pp. 459-461.
W. Schone, et al; Diode-Pumped High-Power cw Nd:YAG Lasers; W. Waidelich, et al (eds); Laser in Forschung and Technik; 1996.
Digiovanni, et al; High Power Fiber Lasers and Amplifiers; Optics & Photonics News, Jan. 1999.
ASML YieldStar T-250D product sheet; ASML Product Catalog; Jan. 20, 2014.
ASML YieldStar S-250D product sheet; SML Product Catalog; Jan. 20, 2014.
Energetiq Technology Inc; Operation manual for LDLS™ Laser-Driven Light Source; Aug. 2009.
Bussiahn; Experimental and theoretical investigations fo a low-pressure HE-Xe discharge for lighting purpose; Jounral of Applied Physics vol. 95, No. 9 May 1, 2004.
V.P. Zimakov, et al; Bistable behavior of a continuous optical discharge as a laser beam propagation effect; Laser Resonators, Microresonators, and Beam Control XV; vol. 8600, 860002 • 2013 SPIE.
Fridman, et al; Plasma Physics and Engineering, Second Edition; Published in 2011 by Taylor & Francis, pp. 409-424; 639-640.
Energetiq Technology, Inc.; Model EQ-1500, LDLS™ Laser-Driven Light Source, Operation Manual, May 2011.
Energetiq Technology, Inc.; Model EQ-77, LDLS™ Laser-Driven Light Source Operation Manual, Dec. 2015.
Energetiq Technology, Inc.; Model EQ-90, LDLS™, Laser-Driven Light Source, Operation and Maintenance Manual, Jan. 2014.
Raizer, "Optical discharges," Soviet Physics Uspekhi 23(11) (1980).
Energetiq Technology, Inc.; Operation and Maintenance Manual, Model EQ-99X, LDLS Laser-Driven, Light Source, Rev. 1 (Jan. 2014).
Energetiq Technology, Inc.; Operation and Maintenance Manual, Model EQ-99-FC, LDLS Laser-Driven Light Source, Rev. 2 (Mar. 2012).
Energetiq Technology, Inc.; Operation and Maintenance Manual, Model EQ-99X-FC, LDLS Laser-Driven Light Source, Rev. 1 (Jan. 2014).
Energetiq Technology, Inc.; Operation and Maintenance Manual, Model EQ-9-N, LDLS Laser-Driven Light Source, Rev. 6 (Sep. 2015).
Energetiq Technology, Inc.; A presentation titled "EQ-400 LDLS Laser-Driven Light Source," dated Feb. 2, 2015.
A presentation titled "Energetiq Laser-Driven Light Sources," dated Apr. 21, 2015.
A presentation titled "ASML BV LDLS Roadmap," Jun. 11, 2013.
Nanometrics, Organic Growth Opportunities for Nanometrics in Process Control, Jan. 2016.

(56) References Cited

OTHER PUBLICATIONS

A presentation titled "LDLS Laser-Driven Light Source," dated Jul. 8, 2011.
Castellano, "Are the Brains At ASML Hurting Investors With High And Ambitious R&D Costs?" Jul. 20, 2015.
M. W. P. Cann, Light Sources in the 0.15-20-μ Spectral Range, vol. 8 No. 8 Applied Optics (1969).
Kuhn, Kelin; Laser Engineering; Prenice-hall Inc, 1998; pp. 384-440.
Moulton, Peter F.; Tunable Solid-State Lasers; Proceedings of the IEEE, vol. 80, No. 3, Mar. 1992.
Koch, K.K.; Sodium Plasma Produced by Milliwatt cw Laser Irradiation; Journal of the Optical Society of America; vol. 70, No. 6; Jun. 1980.
E. B. Saloman; Energy Levels and Observed Spectral Lines of Xenon, XeI through XeLIV; J. Phys. Chem. Ref. Data, vol. 33, No. 3, 2004.
Lothar Klein; Measurements of Spectral Emission and Absorption of a High Pressure Xenon Arc in the Stationary and the Flashed Modes; Apr. 1968; vol. 7, No. 4, Applied Optics.
Hailong Zhou, et al; Conductively cooled high-power, high-brightness bars and fiber coupled arrays; High-Power Diode Laser Technology and Applications III, edited by Mark. S. Zediker, Proc. of SPIE vol. 5711 (SPIE, Bellingham, WA, 2005).
Ytterbium-doped large-core fibre laser with 1 kW of continuous-wave output power; Y. Jeong, et al; Electronics Letters Apr. 15, 2004 vol. 40 No. 8.
Bussiahn, R. et al, "Experimental and theoretical investigations of a low-pressure He-Xe discharge for lighting purpose" Journal of Applied Physics, vol. 95, No. 9, May 1, 2004, pp. 4627-4634.
Beck, Simple Pulse Generator for Pulsing Xenon Arcs with Hight Repetition Rate, Rev. Sci. Instrum., vol. 45, No. 2, Feb. 1974, pp. 318-319.
Carlhoff, et al, "Continuous Optical Discharges at Very High Pressure," Physica 103C, pp. 439-447.
Fiedorowicz et al, X-Ray Emission from Laser-Irradiated Gas Puff Targets, Appl. Phys. Lett. 62 (22). May 31, 1993.
Franzen, "CW Gas Breakdown in Argon Using 10.6-um Laser Radiation," Appl. Phys. Lett. vol. 21, No. 2 Jul. 15, 1972 pp. 62-64.
Generalov et al "Continuous Optical Discharge," ZhETF Pis. Red. 11, No. 9, May 5, 1970, pp. 302-304.
Jeng et al, Theoretical Investigation of Laser-sustained Argon Plasmas J.Appl.Phys. 60 (7), Oct. 1, 1986 pp. 2272-2279.
Nakar, "Radiometric Characterization of Ultrahight Radiance Xenon Short-arc Discharge Lamps" Applied Optics, vol. 47 No. 2, Jan. 9, 2008, pp. 224-229.
Moody, "Maintenance of a Gas Breakdown in Argon Using 10.6-u cw Radiation," Journal of Applied Physics, vol. 46 No. 6, Jun. 1975, pp. 2475-2482.
Keefer, et al "Experimental Study of a Stationary Lesser-Sustained Air Plasma", Journal of Applied Physics, vol. 46., No. 3, Mar. 1975, pp. 1080-1083.

\* cited by examiner

LASER-OPERATED LIGHT SOURCE

CROSS-REFERENCE TO RELATED APPLICATIONS

This application claims the benefit of German Patent Application Ser. No. 10 2013 110 387.1, filed Sep. 20, 2013, entitled "Laser-Operated Light Source," which is incorporated by reference herein in its entirety.

FIELD OF THE INVENTION

The present invention is generally related to laser-operated light sources.

BACKGROUND OF THE INVENTION

Laser-operated light sources are generally known and are used in spectroscopy or surface inspection, for example for measuring purposes.

Known laser-operated light sources, which will also be referred to in short as light sources hereinbelow, encompass a chamber for accommodating a pressurized ionizable gas, as well as an ignition source for ionizing the gas in the chamber for generating a plasma. The known light sources furthermore encompass a laser for inputting laser energy into the plasma such that, under the impact of the laser radiation, the plasma generates useful light, which forms the output signal of the light source. For transferring to a downstream process, provision is made for means for coupling the useful light into a transferring optical fiber. The known light sources furthermore encompass an optical system, which is arranged between the chamber and the transferring optical fiber, for imaging the plasma on the end of the optical fiber, which faces the optical system. The light output from the chamber may exhibit undesirable characteristics, for example, chromatic, spherical, and/or coma aberrations. Further, the optical system arranged between the chamber and the transferring optical fiber may also introduce such undesirable characteristics into the light entering the optical fiber. Therefore, a heretofore unaddressed need exists for a laser-operated light source that will address deficiencies and inadequacies of prior structures.

SUMMARY OF THE INVENTION

Embodiments of the present invention provide a laser-operated light source. Briefly described, in architecture, one embodiment of the system, among others, can be implemented as follows. The system includes a chamber for accommodating an ionizable gas and an ignition source for ionizing the gas in the chamber for generating a plasma. The light source encompasses a laser for inputting laser energy into the plasma such that, under the impact of the laser radiation, the plasma emits useful light, which forms the output signal of the light source, wherein provision is made for means for coupling the useful light into a transferring optical fiber. An optical system for imaging the plasma onto the end of the optical fiber, which faces the optical system, is arranged between the chamber and the transferring optical fiber, wherein the optical system is corrected for reducing the chromatic aberration.

The invention is based on the object of specifying a laser-operated light source, the optical quality of which is improved.

The invention is based on the knowledge that optical quality of the light source is negatively influenced, in particular with regard to the homogeneity of the generated light, when a color aberration and/or spherical aberration appears in response to the imaging of the plasma onto the end of the optical fiber, which faces the optical system. Based on this, the invention is based on the idea of reducing or avoiding a color aberration, which is introduced through the optical system, and to thus increase the optical quality of the light source.

Accordingly, the invention provides for the optical system to be corrected for reducing the chromatic aberration. Due to a corresponding achromatic correction or use of an achromatic optical system, respectively, the wavelengths, which differ most from one another in the spectrum of the visible light, for example, or the primary colors red and blue, respectively, are brought together, so that the corresponding color aberration is at least minimized in this manner. It turned out that such an achromatic correction of the optical system, which is known by itself, is of large importance in the case of a laser-operated light source, in that the optical quality of the light source is improved significantly, in particular with regard to the homogeneity of the generated light.

According to the invention, it is sufficient, on principle, when an achromatic correction of the optical system is applied or when an achromatic optical system is used, respectively. The optical quality of the light source, however, can be increased further in that the optical system is corrected apochromatically or superachromatically. As an exemplary embodiment, three colors, for example the primary color green, are brought together with the two other primary colors red and blue when applying an apochromatic correction or in response to the use of an apochromatic optical system, respectively.

Another advantageous further development of the invention provides for the optical system to encompass collimating optics for collimating an image of the plasma and a focusing optics for focusing the image of the plasma onto the end of the optical fiber, which faces the optical system.

According to the invention, the optical quality of the light source can be improved further by correcting further optical parameters of the optical system, in particular also with regard to an adaptation of the optical system and of the optical fiber to one another. In this context, an advantageous further development of the invention provides for the optical system to be embodied and equipped in such a manner with regard to its magnification that the imaging of the plasma in the inlet plane of the optical fiber equals the diameter of the light-guiding core of the optical fiber in the inlet plane or is smaller than it. In this manner, all of the light, which is available in response to the imaging of the plasma by the optical system, is coupled into the optical fiber by means of light, so that the light yield or brightness of the light source, respectively, is optimized further. In the case of this embodiment, it is also possible to select the magnification such that the imaging of the plasma in the inlet plane of the optical fiber is slightly larger than the diameter of the light-guiding core of the optical fiber in this plane. In this manner, the fiber is quasi slightly "overfilled" with light, so that a high light yield is ensured even in the case of certain adjusting tolerances with regard to the orientation of the optical fiber to the optical system.

Another advantageous further development of the invention provides for the numerical aperture of the optical system and the numerical aperture of the optical fiber to be adapted to one another, in particular such that opening angle of the optical system at the image side equals the acceptance angle of the optical fiber or is smaller than it. In this manner, it is ensured that the light beams emanating from the optical system are reflected totally in the desired manner in the optical fiber and are not diffracted in the jacket of the optical fiber. In the case of this exemplary embodiment, the opening angle of the optical system at the image side can, on principle, be chosen to be equal to the acceptance angle of the optical fiber. To create a certain tolerance for adjusting errors, it might be advantageous, however, to choose the opening angle of the optical system at the image side to be slightly larger than the acceptance angle of the optical fiber.

Another advantageous further development of the invention provides for the light source to emit useful light within the visible spectral range.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
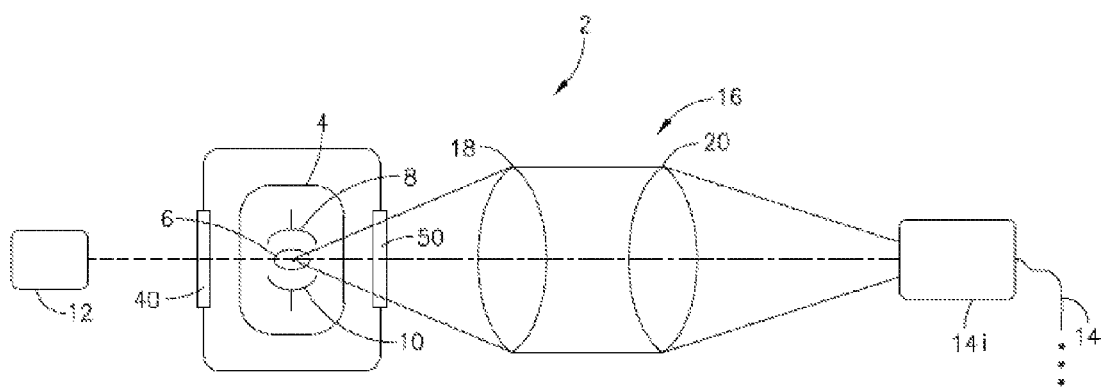
FIG. 1 is a schematic diagram showing an exemplary embodiment of a light source according to the invention in a highly diagrammed schematic diagram.

The following definitions are useful for interpreting terms applied to features of the embodiments disclosed herein, and are meant only to define elements within the disclosure. No limitations on terms used within the claims are intended, or should be derived, thereby. Terms used within the appended claims should only be limited by their customary meaning within the applicable arts.

As used within this disclosure, "substantially" means "very nearly," or within normal manufacturing tolerances. For example, a substantially flat window, while intended to be flat by design, may vary from being entirely flat based on variances due to manufacturing.

As used within this disclosure, "useful light" generally refers to light within the visible spectrum and the near infrared spectrum, for example, preferably within 400-950 nm, but not limited to this range. For example, for a particular application, useful light may include at least some portion of the ultraviolet spectrum.

As used within this disclosure, the "visible spectrum" is the portion of the electromagnetic spectrum that is visible to (can be detected by) the human eye. In terms of frequency, this corresponds to a band in the vicinity of 430-790 nm.

As used within this disclosure, "collimated light" is light whose rays are substantially parallel, and therefore will spread minimally as it propagates.

As used within this disclosure, a "lens" refers to an optical element that redirects/reshapes light passing through the optical element. In contrast, a mirror or reflector redirects/reshapes light reflected from the mirror or reflector.

As used within this disclosure, "chromatic aberration" refers to the phenomenon of different colors focusing at different distances from an optical element, such as a lens.

As used within this disclosure, "spherical aberration" refers to the phenomenon of light from a spherical light source encountering a non-spherical (or incorrectly placed spherical) optical element, introducing angular distortion at different distances from an optical element, such as a lens.

As used within this disclosure, "coma aberration" or "comatic aberration", in an optical system refers to aberration inherent to certain optical designs or due to imperfection in a lens or other components that result in off-axis point sources appearing distorted, and in particular, due to a variation in magnification over the entrance pupil. Comatic aberration may be a function of wavelength, in which case it is a form of chromatic aberration.

As used within this disclosure, an "apochromat," or "apochromatic lens", is a lens that corrects for of chromatic and spherical aberration better than the much more common achromat lenses. Achromatic lenses are generally corrected to bring two wavelengths, for example but not limited to, red and blue, into focus in the same plane. Apochromatic lenses are generally designed to bring three wavelengths, for example but not limited to red, green, and blue into focus in the same plane. Apochromats may also be corrected for spherical aberration at two wavelengths, rather than one as in an achromat.

Reference will now be made in detail to embodiments of the present invention, examples of which are illustrated in the accompanying drawings. Wherever possible, the same reference numbers are used in the drawings and the description to refer to the same or like parts. In a highly diagramed schematic diagram, FIG. 1 shows a first exemplary embodiment of a light source 2 according to the invention, which encompasses a chamber 4 for accommodating an ionizable gas, which, in the case of this exemplary embodiment, is formed by Xenon. Other ionizable gasses which form a plasma and emit light when energized by a laser light source may also be used. The light source 2 further encompasses an ignition source for ionizing the gas in the chamber 4 for generating a plasma 6, which is suggested diagrammatically in FIG. 1, wherein the ignition source is formed by a pair of electrodes 8, 10 in the case of this exemplary embodiment.

The light source 2 furthermore encompasses a laser 12. The laser 12 may be for example, a single wavelength laser with a small bandwidth configured to pump the absorption lines of the ionizable gas within the chamber 4. The laser 12 generates a beam for inputting laser energy into the plasma 6 via an input window 40 of the chamber 4 such that the plasma 6 emits useful light under the impact of the laser radiation via an output window 50 of the chamber 4. The output window 10 may be, for example, but not limited to, a planar window, or a spherical window. The configuration of the output window 50 may generally influence output light. For example, a planar output window 50 may introduce greater spherical aberrations to the light than a spherical output window 50. However, a spherical output window 50 may also produce spherical aberrations if the ignited plasma is not collocated with the focal center of the spherical output window 50. Therefore, a flat output window 50 may be preferable to allow for tolerances in the location of the ignited plasma 6 within the chamber 4.

The configuration of the output window 50, along with the configuration of succeeding optics in the optical train, influences the type of chromatic/spherical/comatic correction that the optical system 16 may perform. Therefore, the design of the optical system 16, for example, the collimating lens 18 and the focusing lens 20, seeks to balance the correction of these aberrations across the optical system 16, including the design of the collimating lens 18 and the focusing lens 20. For example, the correction may be designed into the optical system 16 by modeling the lenses 18, 20 to provide a desired optical coupling of the output light with the optical fiber 14, and balancing the aberration correction with the input requirements of the coupling of the optical fiber 14 at the input plane, or inlet end 14*i* of the optical fiber 14.

In the case of the illustrated exemplary embodiment, the light source 2 is configured to emit useful light within the visible wavelength range. However, in other embodiments the useful light may extend beyond the visible wavelength range, for example, into the near infrared range. The emitted useful light forms the output signal of the light source 2.

The light source 2 furthermore encompasses means for coupling the useful light into a transferring optical fiber 14, for example, a multimode optical cable, a single mode optical cable, or a bundled optical cable. For this purpose, provision can be made for a fiber coupler, which is not illustrated in FIG. 1 for reasons of clarity. Provision is made between the chamber 4 and the optical fiber 14 for an optical system 16, which is symbolized diagrammatically in FIG. 1 by means of two lenses 18, 20, and which serves to image the plasma 6 onto the inlet end 14*i* of the optical fiber 14, which faces the optical system 16. While referred to in the singular for convenience, the collimating lens 18 may be a single lens or a series of multiple optical elements, and the focusing lens 20 may be a single lens or a series of multiple optical elements.

To operate the light source 2, the gas, which is collected in the chamber 4 under pressure may be initially ionized by applying a voltage to the electrodes 8, 10, so that the plasma 6 is created. The laser 12 irradiates laser light into the plasma 6, which is formed in this manner, which then emits useful light, among others, as output signal of the light source 2. In addition to the useful light, the plasma 6 might possibly emit stray radiation in response to irradiation with the laser radiation. The stray radiation, however, is of no further interest in the context according to the invention, and will thus not be explained in detail herein.

The optical system 16 images the plasma 6 and focuses the image onto the inlet end 14*i* of the optical fiber 14, which faces the optical system 16, so that the useful light is coupled into the optical fiber 14 in this manner. Via the optical fiber 14, the useful light is transferred to a downstream process, for example a process in the context of wafer inspection (not shown) or in the context of a lithography process (not shown) in response to chip production.

According to the first embodiment, the optical system 16 is corrected for reducing the chromatic aberration caused by, for example, multiple wavelengths of light produced by the laser 12. In the case of the illustrated exemplary embodiment, the optical system is corrected apochromatically, so that, as a result, an apochromatic system is formed, in the case of which the primary colors red, green and blue, for example, are brought together due to the optical correction and color aberrations, which originate from the chromatic aberration of the optical system 16, are reduced, preferably minimized. A reducing of color aberrations in terms of the invention is understood such that the color aberrations are reduced in the case of the optical system as compared to a non-achromatically or apochromatically corrected optical system, respectively. Ideally, the color aberrations, which originate from the chromatic aberration, have been corrected to such an extent that remaining residual aberrations in the context of the downstream process have no practice-relevant impact on the light, which is generated by the light source 2 and which is transferred via the optical fiber 14.

In the case of the illustrated first exemplary embodiment, the optical system 16 is equipped in such a manner with regard to its magnification that the imaging of the plasma 6 in an inlet end 14*i* of the optical fiber 14 equals the diameter of the light-guiding core of the optical fiber in the inlet plane or is larger than it. On the one hand, a more homogenous distribution of the useful light may be attained in the optical fiber 14 when the imaging of the plasma 6 is larger than the diameter of the light-guiding core of the optical fiber 14. In contrast, when the imaging size is equal to or smaller than the diameter of the light-guiding core of the optical fiber, a larger portion of the useful light is irradiated into the optical fiber 14.

To compensate for certain adjusting tolerances of the optical fiber 14 relative to the optical system 16, for example, correctly positioning the optical fiber in relation to the imaging of the plasma 6, the diameter of the imaging of the plasma 6 in the inlet plane of the optical fiber 14 can also be slightly larger than the diameter of the light-guiding core of the optical fiber 14 in the inlet end 14, for example up to 110% or more, so that the optical fiber 14 is quasi slightly "overfilled" with the useful light. If assuming by approximation with regard to the imaging of the plasma 6 by the optical system that the plasma 6 approximately has the shape of a circle in a plane, which runs perpendicular to the optical axis of the optical system, the radius of the plasma is understood to be the distance of the center point of the plasma, thus the location, at which the plasma has the highest intensity, to a radial point, on which the intensity of the plasma has decreased to $1/e^2$ of the intensity as compared to the highest intensity. In the case of the illustrated exemplary embodiment, the numerical aperture of the optical system 16 and the numerical aperture of the optical fiber 14 are adapted to one another such that the opening angle of the optical system at the image side equals the acceptance angle of the optical fiber or is larger than it. To explain the acceptance angle, reference is initially made to FIG. 2.

Figure 2:
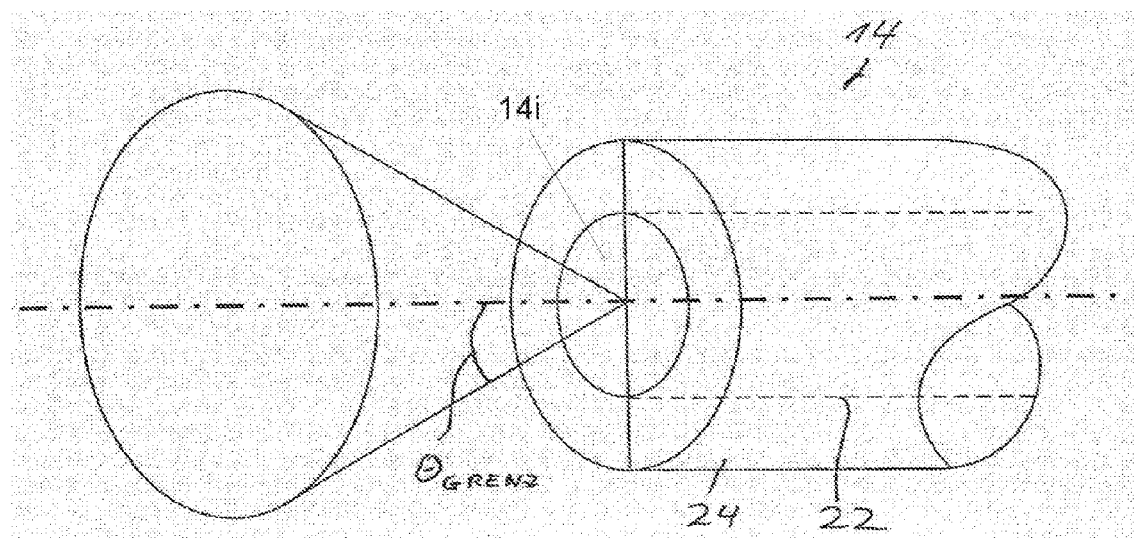
FIG. 2 is a schematic diagram for explaining an acceptance angle of a transferring optical fiber of the light source according to FIG. 1.

FIG. 2 shows a schematic diagram of the optical fiber 14, which encompasses a light-guiding core 22 comprising an index of refraction $n_1$ and a jacket 24 having an index of refraction $n_2$. Light beams, which strike the front surface of the optical fiber 14 at an angle which is too large, are not totally reflected in the desired manner, but are diffracted in the jacket 24 of the optical fiber 14. To avoid such diffraction of the light beams in the jacket, the light beams which strike must lie within a so-called acceptance cone, which is determined by the acceptance angle of the optical fiber 14. The context between the numeral aperture (NA) of the optical fiber 14 and the acceptance angle ($\theta_{GRENZ}$) is as follows:

$$NA = \sin\theta_{GRENZ} = \sqrt{n_1^2 - n_2^2} \qquad \text{Eq. 1}$$

The acceptance angle ($\theta_{GRENZ}$) is thus as follows:

$$\theta_{GRENZ} = \arcsin\sqrt{n_1^2 - n_2^2} \qquad \text{Eq. 2}$$

Figure 3:
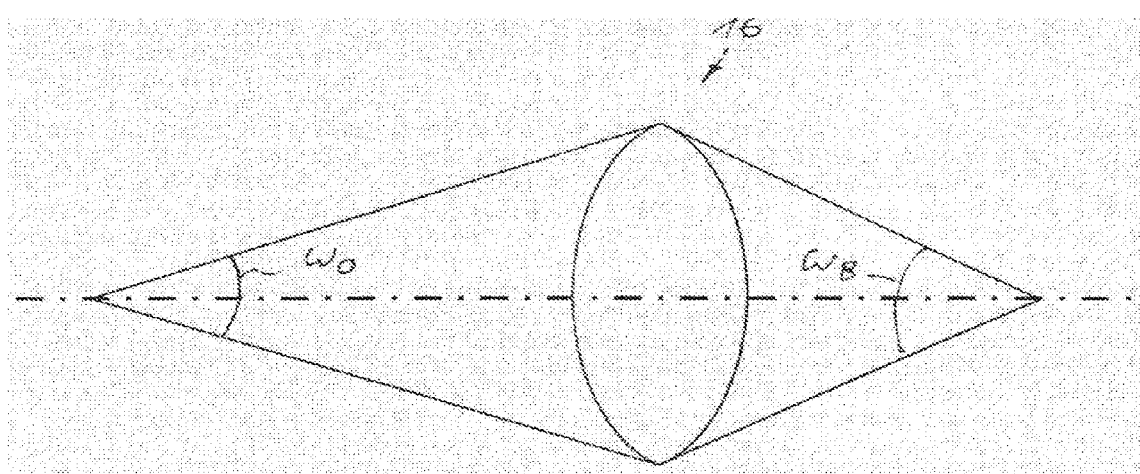
FIG. 3 is a schematic diagram for clarifying the opening angle of an optical system of the light source according to FIG. 1 on the image side.

For explanation of the opening angle of the optical system 16 on the image side, reference is made to FIG. 3. The optical system 16 is symbolized in FIG. 3 by means of a single lens, wherein the opening angle $\omega_O$ at the lens side and the opening angle $\omega_B$ at the image side are illustrated.

The numerical aperture of the optical system 16 and the numerical aperture of the optical fiber 14 are adapted to one another such that the opening angle $\omega_B$ of the optical system 16 at the image side is adpated to the acceptance angle $\theta_{GRENZ}$ of the optical fiber. This adapation can be made such that the opening angle $\omega_B$ of the optical system 16 at the image side is twice as large as the acceptance angle $\theta_{GRENZ}$ of the optical fiber 14. It is ensured in this manner that the light beams emanating from the optical system 16 are totally reflected in the optical fiber 14 in the desired manner and are thus transferred. To compensate for certain tolerances caused by misadjustments of the optical fiber 14 relative to the optical system 16, the opening angle $\omega_B$ at the image side, however, can also be chosen so as to be slightly larger than twice the acceptance angle $\theta_{GRENZ}$ of the optical fiber, for example, up to 110% or more. It thus applies for the adaptation:

$$\omega_B \geq 2 \cdot \theta_{GRENZ} \qquad \text{Eq. 3}$$

Too large an opening angle $\omega_B$ may result in loss of energy in the transfer to the optical fiber 14, while too small an angle the angular homogeniety will be compromised and less light will be transferred.

Figure 4:
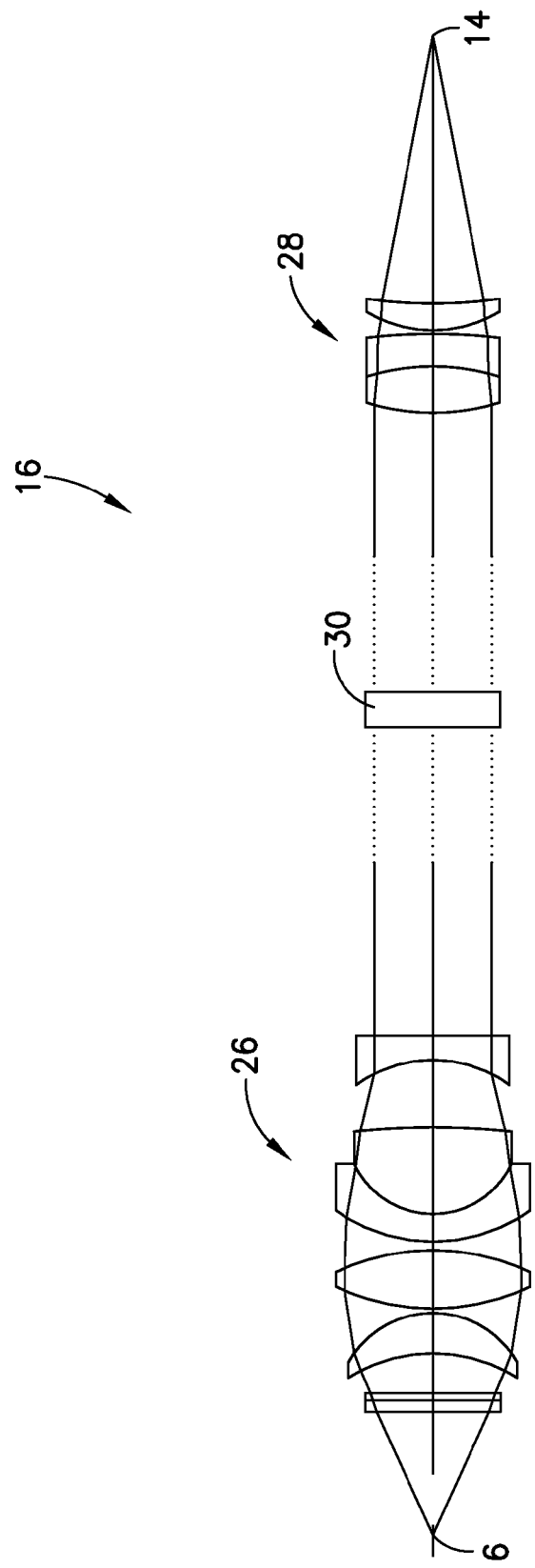
FIG. 4 is a highly diagramed schematic diagram of an exemplary embodiment of an optical system of the light source according to FIG. 1.

FIG. 4 illustrates an exemplary embodiment of an optical system 16, which, according to the invention, is corrected achromatically or apochromatically. For achromatic correction, the optics of the optical system 16 may be corrected in such a way that two wavelengths of the used wavelength spectrum are optimally refracted and meet with the focus the plane of the fiber tip of the optical fiber 14. For apochromatic correction, the optical system 16 may be further corrected to also eliminate the chromatic aberrations for more than two wavelengths, resulting in less dependency of the optical system performance on wavelength changes.

In the case of the illustrated exemplary embodiment, the optical system encompasses collimating optics 26 or lenses for collimating an image of the plasma 6 as well as a focusing optics 28 or lenses for focusing the image of the plasma 6 onto the end of the optical fiber 14, which faces the optical system 16. The choice of having the optics 16 correct achromatically or apochromatically will generally affect the selection of lens configuration and/or lens materials for the collimating optics 26 and the focusing optics 28.

Due to the apochromatic correction of the optical system 16, color aberrations of the optical system, which are caused by chromatic aberration, are reduced, preferably minimized, so that the functional reliability of the light source 2 is improved in this manner. If desired, color filters for spectrally filtering the useful light, as is symbolized by a filter 30 in FIG. 4, can be arranged between the collimating optics 26 and the focusing optics 28 in the light path of the useful light. The filter 30 may perform other functions instead of or in addition to color filtering, for example, functioning as a polarization filter.

The design of the optical system 16 involves balancing the objective of transferring the light output of the chamber 4 (FIG. 1) into the optical fiber 14 using collimating optics 26 and focusing optics 28 in a way that optimizes the plasma image in terms of size and angle, along with correcting for aberrations produced by the output window 50 of the chamber 4 (FIG. 1) and correcting for or avoiding aberrations that may be introduced by the collimating optics 26 and focusing optics 28 themselves.

Figure 5:
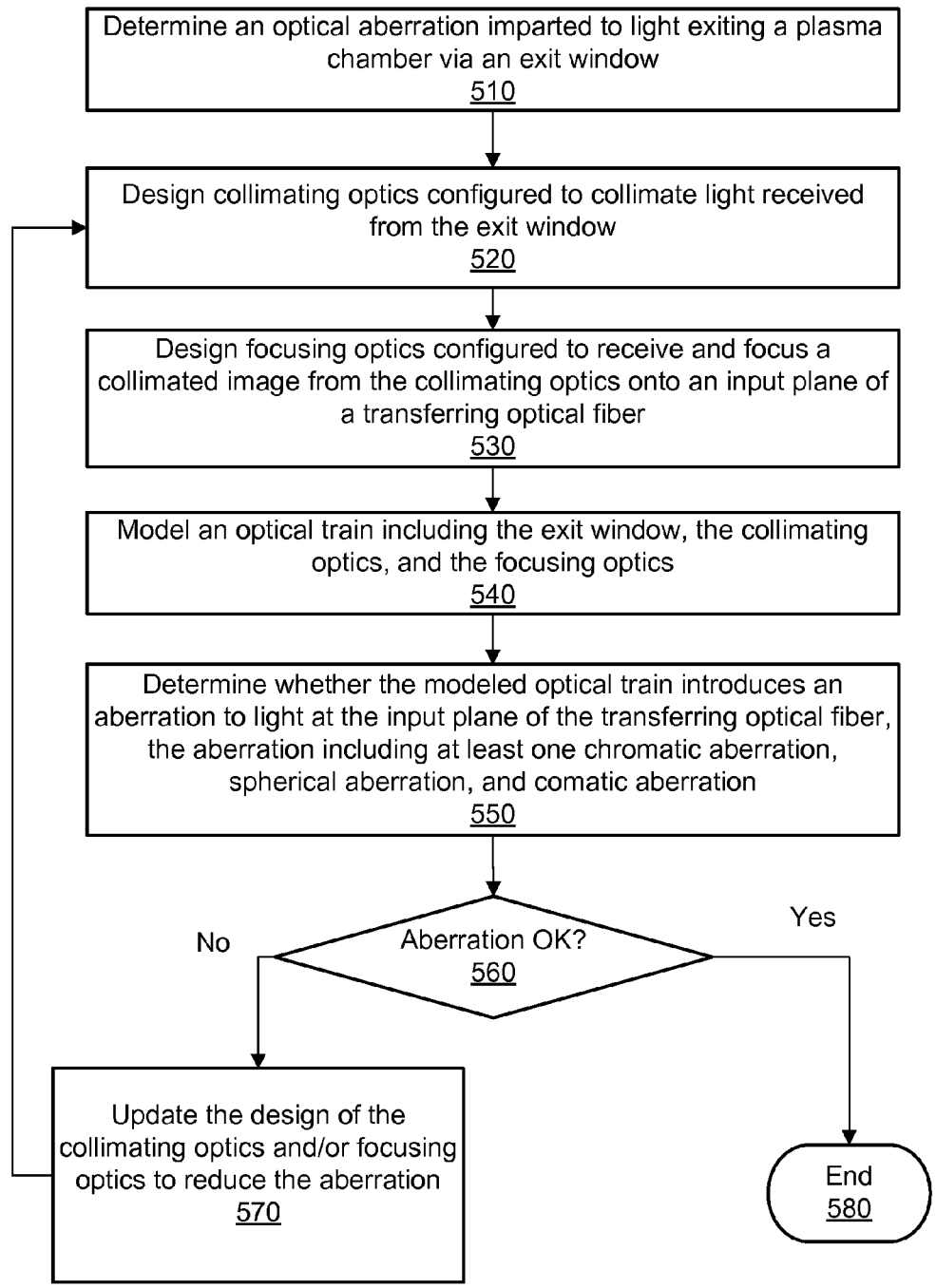
FIG. 5 is a flowchart of an exemplary method for designing an optical system for receiving light from a laser excited plasma chamber including an output window and a transferring optical fiber.

FIG. 5 is a flowchart of an exemplary method for designing an optical system 16 for receiving light from a laser excited plasma chamber 4 including an output window 50 and a transferring optical fiber 14. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

The amount of optical aberration (if any) imparted to light exiting the chamber via the output window 50, is determined, as shown by block 510. Collimating optics 26 are designed to collimate light received from the output window 50, as shown by block 520. Focusing optics 28 are designed to receive and focus a collimated image from the collimating optics 26 onto an input plane of the transferring optical fiber 14, as shown by block 530. An optical train including the output window 50, the collimating optics 26, and the focusing optics 28 is modeled, for example, with optical system modeling software, as shown by block 540. It is determined whether the modeled optical train introduces an aberration to light at the input plane of the transferring optical fiber 14, as shown in block 550, where the aberration including at least one chromatic aberration, spherical aberration, and comatic aberration. If the level of aberration introduced by the output window 50, the collimating optics 26, and the focusing optics 28 is acceptable, as shown by decision block 560, the method is complete, as shown by block 580. Otherwise, the design of the collimating optics and/or focusing optics is updated to reduce the aberration, as shown by block 570.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

We claim:

1. A laser-operated light source, comprising:
   a chamber for accommodating an ionizable gas and a plasma formed by energizing the ionizable gas, the chamber further comprising an output window selected from the group consisting of a flat output window and a spherical output window;

a laser for inputting laser energy into the plasma such that, under the impact of the laser radiation, the plasma emits useful light out of the output window, which forms the output signal of the light source;

means for coupling the useful light into a transferring optical fiber; and an optical system arranged between the chamber output window and the transferring optical fiber, configured to balance a correction of aberrations of the output window and image the plasma onto the end of the optical fiber facing the optical system, wherein the optical system is configured to correct chromatic aberration.

2. The light source according to claim 1, wherein the optical system further comprises collimating optics and focusing optics arranged downstream from the collimating optics.

3. The light source according to claim 1, further comprising an ignition source for ionizing the gas in the chamber for generating the plasma.

4. The light source according to claim 1, wherein the optical system is corrected for more than two wavelengths of the useful light.

5. The light source according to claim 1, characterized in that, with reference to its magnification, the optical system is configured such that the imaging of the plasma in the inlet plane of the optical fiber equals the diameter of the light-guiding core of the optical fiber or is larger than it.

6. The light source according to claim 1, characterized in that, with reference to its magnification, the optical system is configured such that the imaging of the plasma in the inlet plane of the optical fiber is smaller than the diameter of the light-guiding core of the optical fiber.

7. The light source according to claim 1, characterized in that the numerical aperture of the optical system and the numerical aperture of the optical fiber are adapted to one another such that the opening angle of the optical system at the image side is adapted to the acceptance angle of the optical fiber.

8. The light source according to claim 1, characterized in that the light source emits useful light within the visible wavelength range.

9. The light source according to claim 1, wherein the optical system is further configured to correct spherical aberration.

10. The light source according to claim 1, wherein the optical system is further configured to correct comatic aberration.

11. The light source according to claim 2, wherein the optical system further comprises filtering optics.

12. The light source according to claim 11, wherein the filtering optics is disposed between the collimating optics and the focusing optics.

13. An optical system for use between a laser excited plasma chamber comprising an output window and a transferring optical fiber, comprising:

collimating optics configured to receive and collimate a plasma image from the plasma chamber via the output window; and focusing optics configured to receive and focus a collimated image from the collimating optics onto an input plane of the transferring optical fiber, wherein the output window is selected from the group consisting of a flat output window and a spherical output window, the collimating optics and focusing optics are configured to correct aberration introduced by at least one of the output window, the collimating optics, and the focusing optics, and the aberration comprises at least one of the group consisting of chromatic aberration, spherical aberration, and comatic aberration.

14. The optical system according to claim 13, wherein the collimating optics further comprise a plurality of lenses.

15. The optical system according to claim 13, wherein the focusing optics further comprise a plurality of lenses.

16. The optical system according to claim 13, wherein the optical system further comprises filtering optics disposed between the collimating optics and the focusing optics.

17. A method for designing an optical system for receiving light from a laser excited plasma chamber comprising an output window selected from the group consisting of a flat output window and a spherical output window and a transferring optical fiber, comprising the steps of:

determining an aberration imparted to light exiting the chamber via the output window;

designing collimating optics configured to collimate light received from the output window;

designing focusing optics configured to receive and focus a collimated image from the collimating optics onto an input plane of the transferring optical fiber;

modeling an optical train comprising the output window, the collimating optics, and the focusing optics;

configuring the optical train to balance a correction for aberrations of the output window; and determining whether the modeled optical train introduces an optical aberration to light at the input plane of the transferring optical fiber, the aberration comprising at least one of the group consisting of chromatic aberration, spherical aberration, and comatic aberration; and updating the design of the collimating optics and/or focusing optics to reduce the aberration.

18. The method of claim 17, wherein the collimating optics and modeling optics are configured to correct aberration achromatically.

19. The method of claim 17, wherein the collimating optics and modeling optics are configured to correct aberration apochromatically.

20. A laser-operated light source, comprising:

a chamber for accommodating an ionizable gas and a plasma formed by energizing the ionizable gas;

a laser for inputting laser energy of the plasma such that, under the impact of the laser radiation, the plasma emits useful light, which forms the output signal of the light source;

means for coupling the useful light into a transferring optical fiber;

an optical system arranged between the chamber and the transferring optical fiber, configured to image the plasma onto the end of the optical fiber facing the optical system, wherein the optical system is configured to correct chromatic aberration for more than two wavelengths of the useful light.

21. The light source according to claim 20, wherein the optical system further comprises collimating optics and focusing optics arranged downstream from the collimating optics.

22. The light source according to claim 20, further comprising an ignition source for ionizing the gas in the chamber for generating the plasma.

23. The light source according to claim 20, characterized in that, with reference to its magnification, the optical system is configured such that the imaging of the plasma in the inlet plane of the optical fiber equals the diameter of the light-guiding core of the optical fiber or is larger than it.

24. The light source according to claim 20, characterized in that, with reference to its magnification, the optical system is configured such that the imaging of the plasma in the inlet plane of the optical fiber is smaller than the diameter of the light-guiding core of the optical fiber.

25. The light source according to claim 20, characterized in that the numerical aperture of the optical system and the numerical aperture of the optical fiber are adapted to one another such that the opening angle of the optical system at the image side is adapted to the acceptance angle of the optical fiber.

26. The light source according to claim 20, characterized in that the light source emits useful light within the visible wavelength range.

27. The light source according to claim 20, wherein the optical system is further configured to correct one of the group consisting of spherical aberration and comatic aberration.

28. The light source according to claim 21, wherein the optical system further comprises filtering optics.

29. The light source according to claim 28, wherein the filtering optics is disposed between the collimating optics and the focusing optics.

* * * * *